(12) United States Patent
Luo

(10) Patent No.: US 7,808,782 B2
(45) Date of Patent: Oct. 5, 2010

(54) SUPPORT DEVICE FOR HEAT DISSIPATION MODULE

(75) Inventor: Shi-Ping Luo, Kaohsiung (TW)

(73) Assignee: Asia Vital Components Co., Ltd., Kaohsiung (TW)

( * ) Notice: Subject to any disclaimer, the term of this patent is extended or adjusted under 35 U.S.C. 154(b) by 613 days.

(21) Appl. No.: 11/685,779

(22) Filed: Mar. 14, 2007

(65) Prior Publication Data

US 2008/0224019 A1    Sep. 18, 2008

(51) Int. Cl.
*H05K 7/20* (2006.01)
(52) U.S. Cl. ................... 361/700; 165/104.33
(58) Field of Classification Search ............ 361/704, 361/707, 710, 700, 719, 720; 165/80.2, 80.3, 165/104.33, 185; 257/719, 718, 715; 248/505, 248/510
See application file for complete search history.

(56) References Cited

U.S. PATENT DOCUMENTS

| | | | |
|---|---|---|---|
| 6,105,215 A * | 8/2000 | Lee | 24/458 |
| 7,304,850 B1 * | 12/2007 | Sun | 361/709 |
| 7,551,446 B2 * | 6/2009 | Handley et al. | 361/719 |
| 2006/0144572 A1 * | 7/2006 | Yu et al. | 165/104.33 |
| 2006/0158850 A1 * | 7/2006 | Lee et al. | 361/700 |
| 2006/0260787 A1 * | 11/2006 | Wu et al. | 165/104.33 |
| 2007/0217155 A1 * | 9/2007 | Zhao et al. | 361/700 |
| 2007/0251670 A1 * | 11/2007 | Peng et al. | 165/80.4 |

* cited by examiner

*Primary Examiner*—Kimberly T Wood

(57) ABSTRACT

A support device for heat dissipation module provides a frame with four corners thereof extending outward a support part respectively. A mounting opening is disposed at the central area of the frame with two opposite side of the mounting opening having a projection plate respectively. A facial side of the projection plate is provided with fitting pins to fit with a guide heat plate and covering the mounting opening without help of welding. Therefore, thinner guide heat plate can be used for simplifying manufacturing process and lowering production cost.

4 Claims, 9 Drawing Sheets

SUPPORT DEVICE FOR HEAT DISSIPATION MODULE

BACKGROUND OF THE INVENTION

1. Field of the Invention

The present invention is related to a support device for heat dissipation module and particularly to a support device for heat dissipation module capable of employed by electronic equipment.

2. Brief Description of the Related Art

Referring to FIGS. 1 and 2, the conventional support device 10 for heat dissipation module has a frame 11 with an opening 111 inside and a plurality of support parts 12 outside. The outer end of the respective support part 12 has a through hole 121. A guide heat plate 13 is preferably made of copper. The guide heat plate 13 has a base part 131 and a receiving part 132, which connects with the base part 131. The receiving part 132 provides an area slightly less than the base part 131 and corresponds to the opening 111. A surface 1311 of the base part 131, which is next to the receiving part 132 to fit with the frame 11.

The bottom of the receiving part 132 has a first surface 1321 with at least a groove 1322 and the upper side of the receiving part 132 has a second surface 1312, which is flat and closely touches a heat generation unit (not shown). The thickness between the first surface 1321 and the second surface 1312 is greater than that of the frame 11. That is, both the bottom and the upper side of the guide heat plate 13 extend outward beyond the upper surface and the bottom of the frame 11 respectively. Further, junctions among the base part 131, the receiving part 132 and the frame 11 are coated with welding agent for the guide heat plate 13 being joined to the frame 11 firmly.

Referring to FIG. 3, a heat dissipation module 15 at least has a guide heat pipe 16 and a plurality of cooling fins 17. The guide heat pipe 16 has a heat receiving end 161 and a heat emitting end 162. The cooling fins 17 are attached to the guide heat pipe 16 and have a recess 171 corresponding to the receiving part 132 of the guide heat plate 13 such that the heat receiving end 161 of the guide heat pipe 16 exposes to correspond to the recess 171 and connect with the groove 1322. In this way, the support device can be secured to the heat dissipation module 15.

Further, at least a fastening part 18 is provided to have a head end 181 and a fastening end 182. An elastic member 19 is provided to surround the fastening part 18. The fastening end 182 passes through the fastening hole 121 with the elastic member 19 being disposed between the head end 181 and the support part 12 such that the support device 10 and the heat dissipation module 15 are joined to a circuit board (not shown).

Besides, referring to FIGS. 4 and 5, the second conventional support device for heat dissipation module provides a guide heat plate 51. The guide heat plate 51 provides a flat surface for closely touching a heat generation component (not shown) and another surface opposite to the flat surface provides at least a groove 511. Two opposite lateral sides of the guide heat plate 51 provide a fitting groove 512 respectively. Two support parts 52 each have a leg part 521 at both ends thereof with a through hole 522 provided at the leg part 521. A tongue plate 523 is provided at the respective support part 52 to correspond to the fitting groove 512 and welding agent 53 is coated at the joints of the tongue plate 523 and the fitting groove 512. Once the tongue plate 523 is inserted into the fitting groove 512, both tongue plate 523 and the fitting groove 512 are secured to each other with welding.

However, there is a common problem of the preceding two conventional type support devices and the common problem is explained underneath. The frame 11 and the support part 52 are made of alloy with considerable strength to support the heat dissipation module but the guide heat plate 13, 51 is made of copper. Under this circumference, the frame and the support part have to be plated before the guide heat plate 13, 51 being joined to the frame 11 and the support part 52 such that a layer of plating can be created for the welding agent 13, 53 being able to adhere to the frame 11 and the support part 52. Due to the plating operation being a required step prior to the guide heat plate 13, 51 being welded to the frame 11 and the support part 52, it results in the entire manufacturing process is tedious and time consuming.

Further, due to the guide heat plate 13, 51 being adhered with welding agent, the thickness of the guide heat plate 13, 51 has to be increased in order to provide a larger adhering area to accommodate the welding agent for obtaining satisfactory effect of joining with the frame 11 and the support part 52.

In addition, the resource of copper is getting less at the present time but the conventional art needs a great deal of copper for fabricating the heat dissipation module such that it increases material cost inevitably.

SUMMARY OF THE INVENTION

Accordingly, an object of the present invention is to provide a support device, which is capable of securing the guide heat plate directly without welding process, such that the manufacturing process can be simplified and the thickness of the guide heat plate can be reduced significantly.

In order to achieve the preceding object, a support device for heat dissipation module according to the present invention includes a frame providing a mounting opening, two opposite sides of the mounting opening is joined to a projection part, which has an upper surface, respectively in a way of the two sides of the mounting opening being at an elevation different from the upper surface of the projection part and the upper surface of the projection part having at least a fitting pin; a guide heat plate providing fitting holes corresponding to the fitting pin such that the guide heat plate is capable of covering the mounting opening by means of the fitting pins tightly fitting with the fitting holes; and a plurality of support parts each having an inner end being joined to the frame and an outer end extending outward respectively.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE INVENTION

Figure 1:
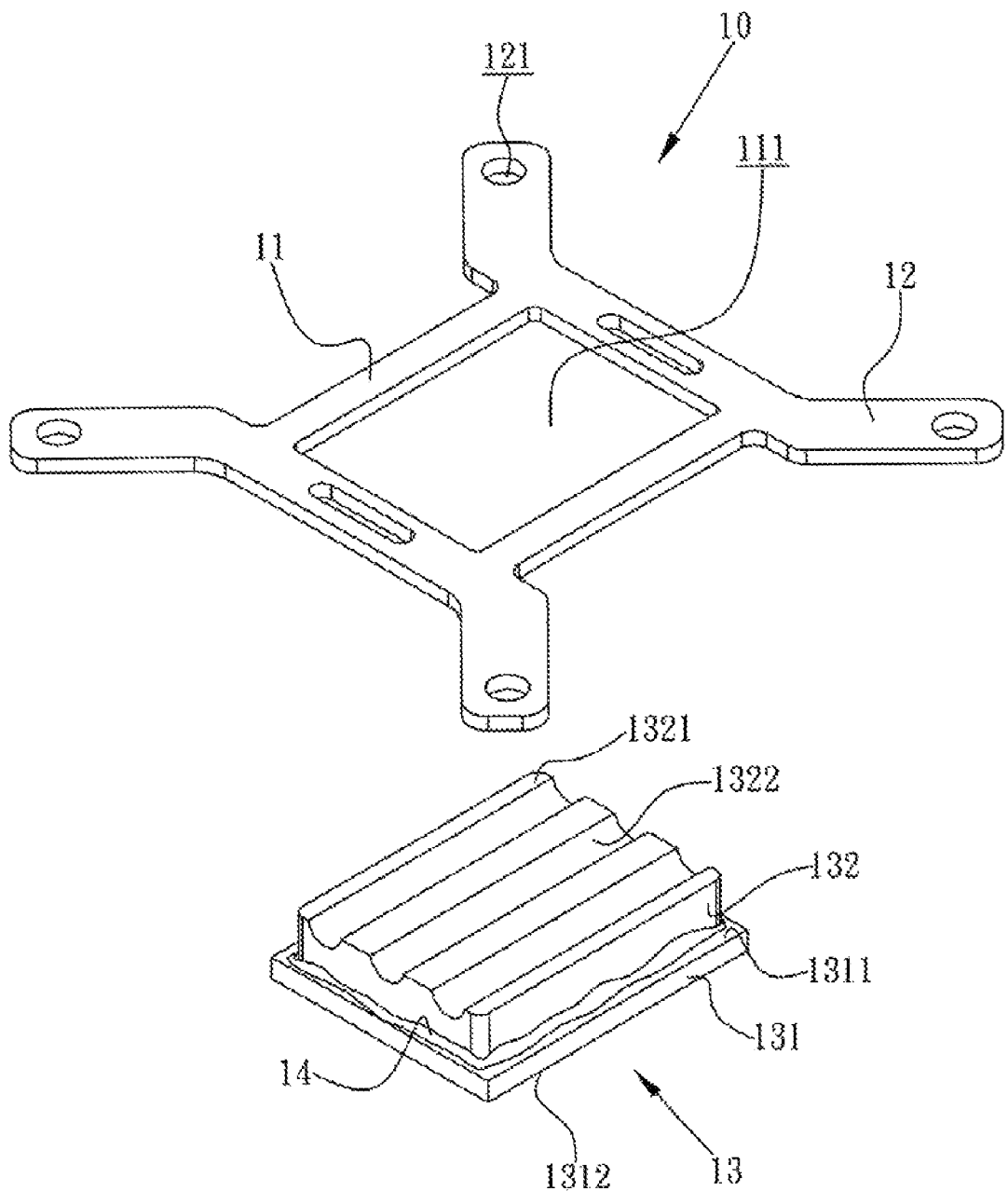
FIG. 1 is a disassembled perspective view of the conventional support device.
Figure 2:
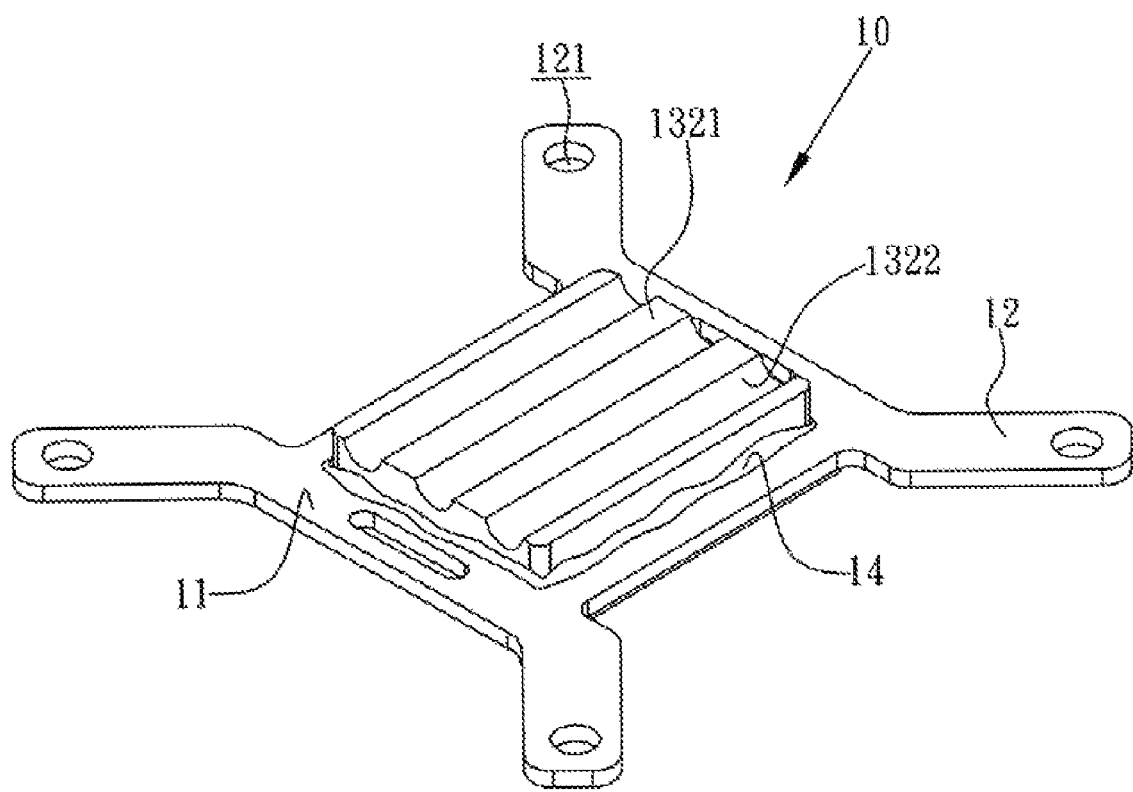
FIG. 2 is an assembled perspective view of the conventional support device shown in FIG. 1.
Figure 3:
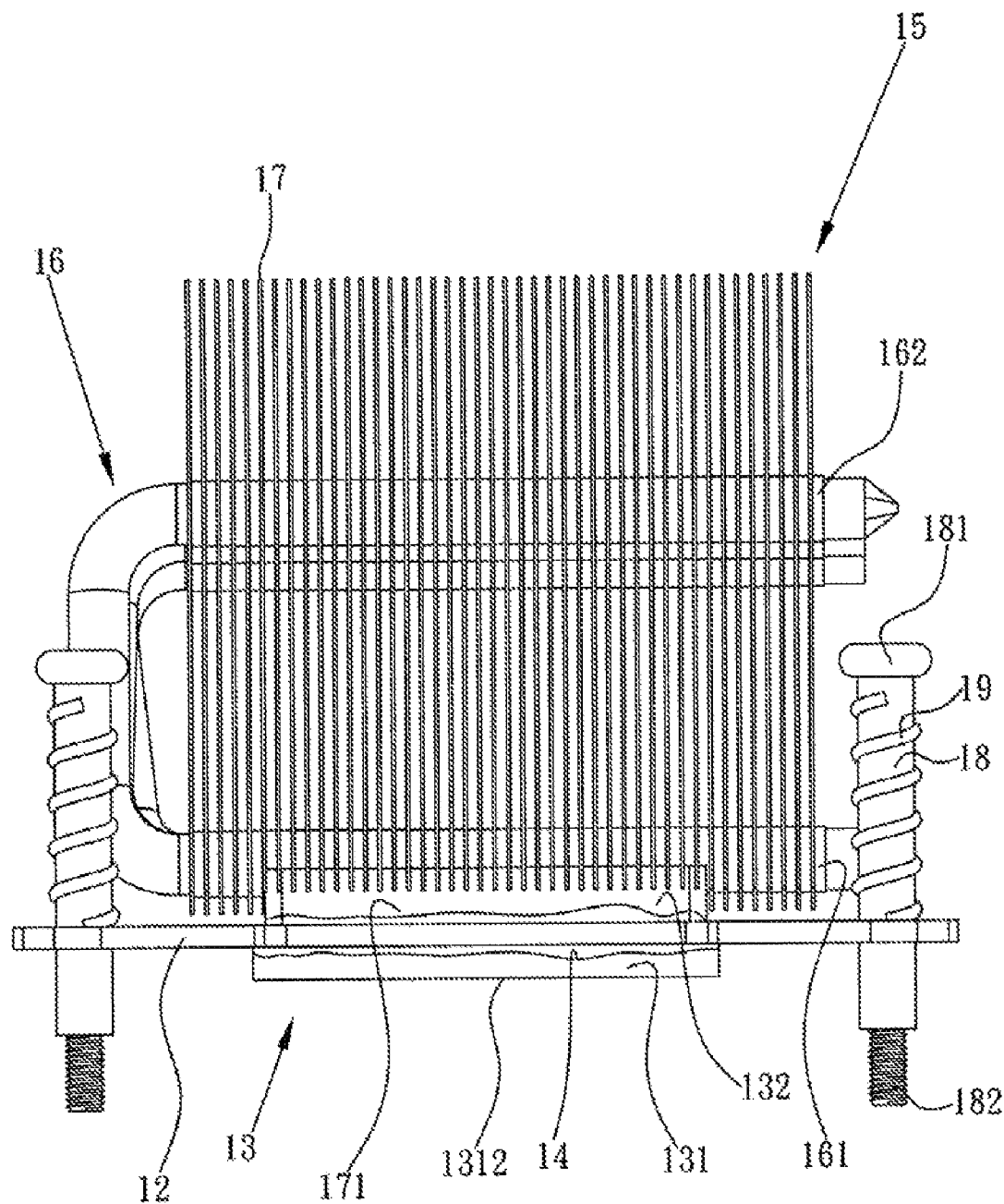
FIG. 3 is a side view of the first type support device joining with a heat dissipation module.
Figure 4:
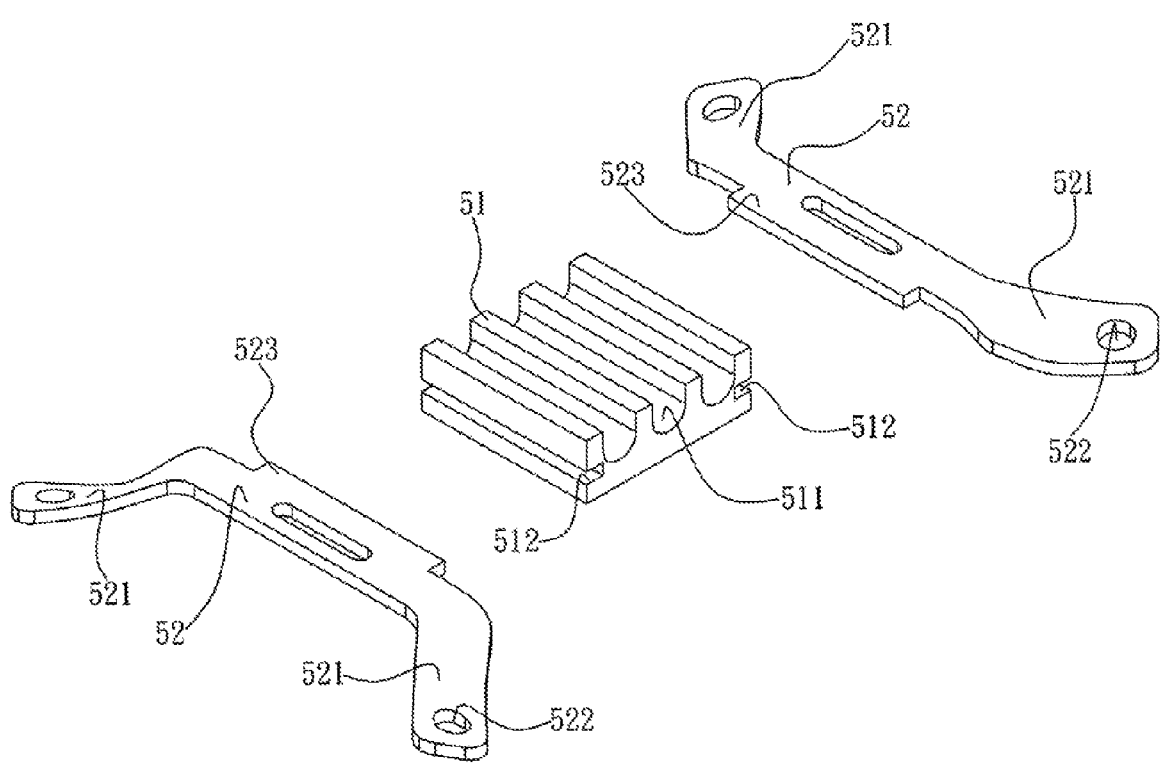
FIG. 4 is a disassembled perspective view of the second type support device.
Figure 5:
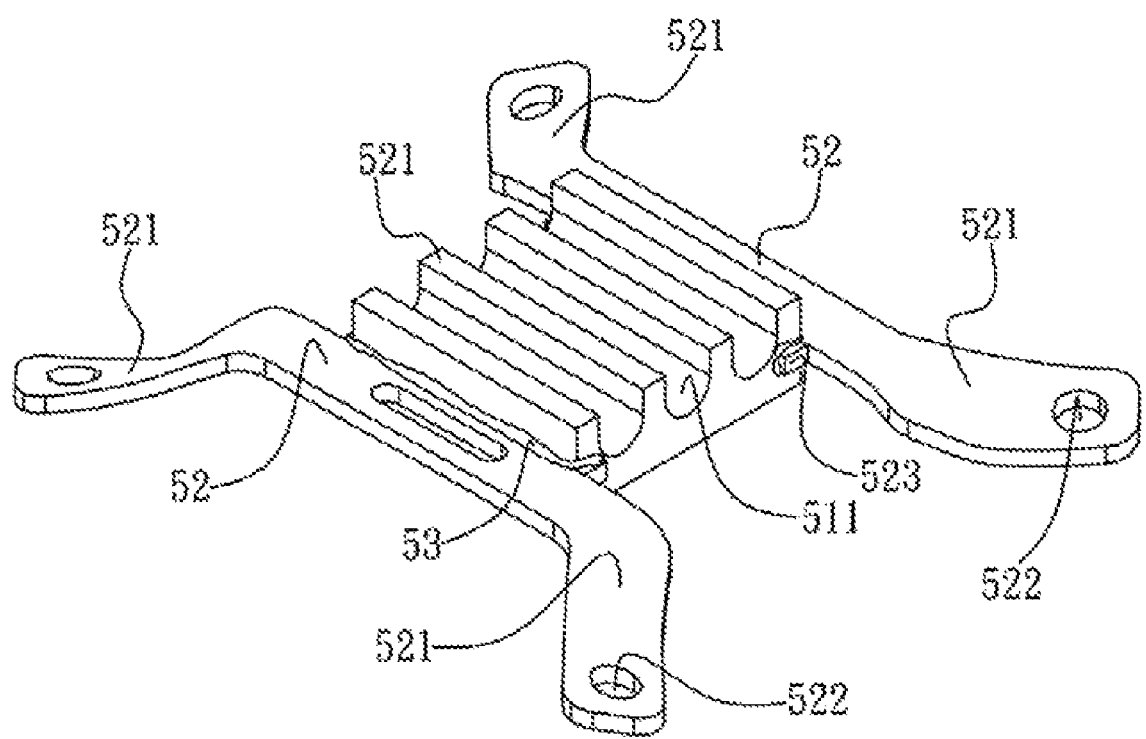
FIG. 5 is an assembled perspective view of the second type support device shown in FIG. 4.
Figure 6:
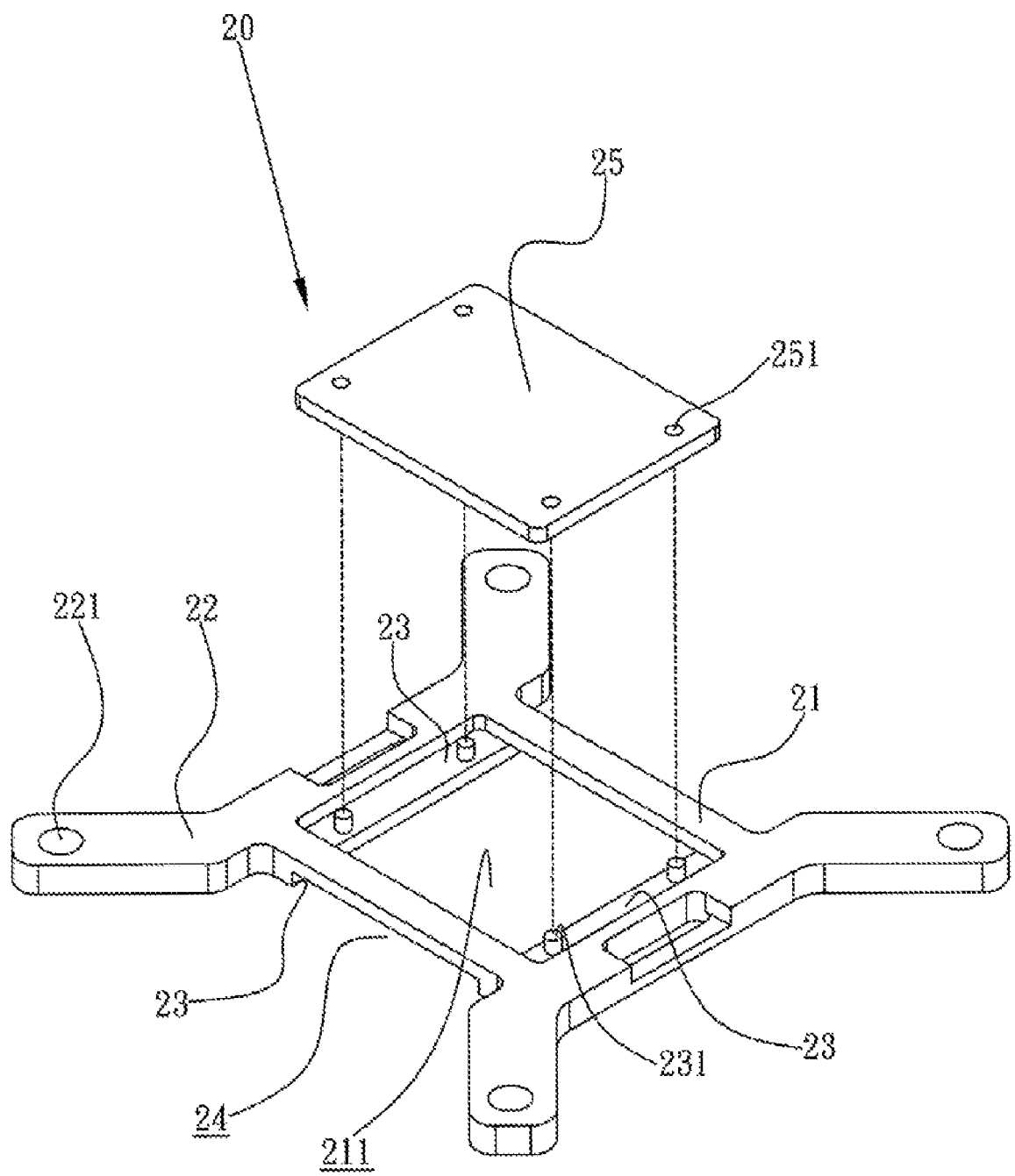
FIG. 6 is a disassembled perspective view of the first embodiment of a support device for heat dissipation module according to the present invention.
Figure 7:
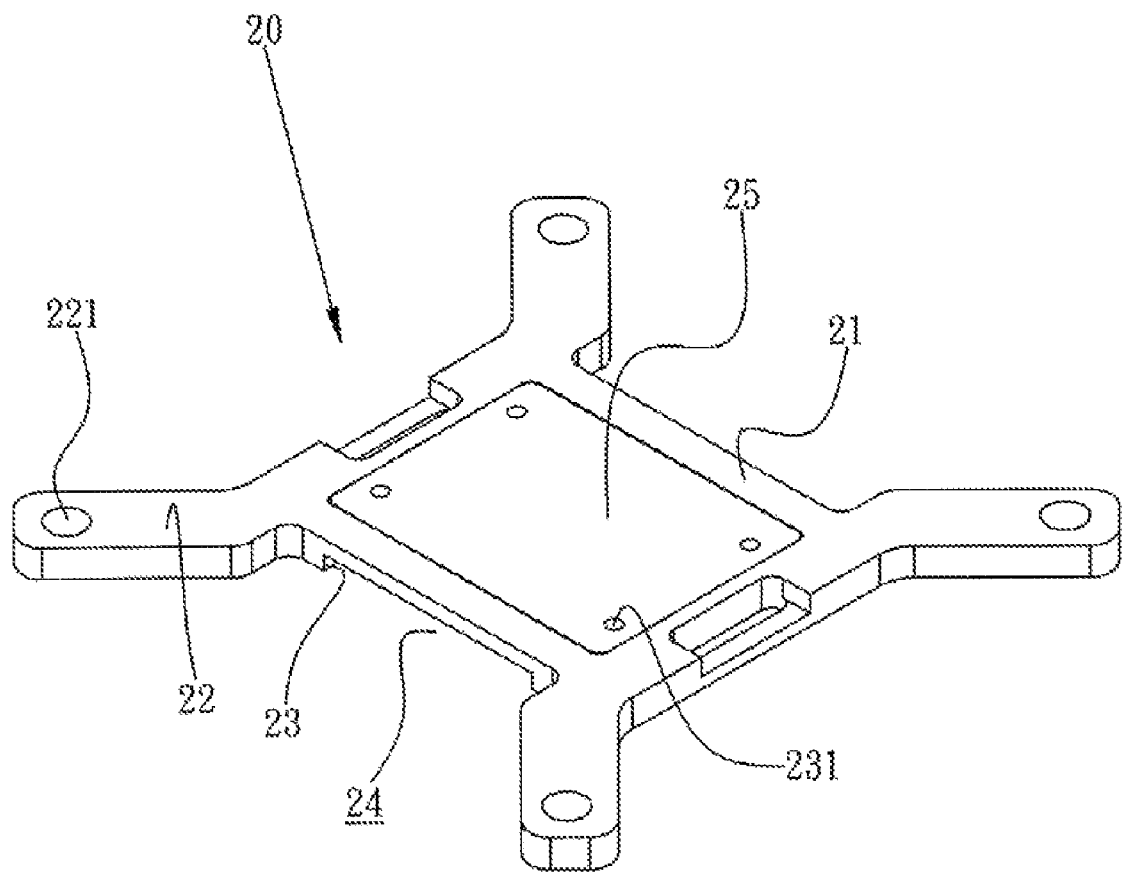
FIG. 7 is an assembled perspective view of the support device shown in FIG. 6.

Referring to FIGS. 6 and 7, the first embodiment of a support device for a heat dissipation module according to the present invention includes a frame 21, a guide heat sheet 25 and a plurality of support parts 22. The frame 21 has a rectangular mounting opening 211 with a projection part 23 at two opposite sides of the mounting opening 211 such that the frame 21 has a downward recess 24 between the two projection parts 23 respectively to communicate with the mounting opening 211. At least a fixing pin 231 is provided on the respective projection part 23.

The guide heat plate 25 is placed on the projections 23 and provides fitting holes 251 corresponding to the fitting pins 231 such that the fitting holes 251 are capable of tightly fitting with the fitting pins 231 in a way of the fitting pins 231 being flush with the upper surface of the guide heat plate 25. Alternatively, the fitting pins 231 are longer than the depth of the respective fitting holes 251 and the upper ends of the fitting pins 231 extend outward the fitting holes 251 while the guide heat plate 25 is placed on the projections 23. Then, the upper ends of the fitting pins 231 are subjected to a pressing force by a device such as a press arbor such that the fitting pins 231 expends radially to be tightly joined to the fitting holes 251 and the upper ends of the fitting pins 231 expand outward against the upper surface of the guide heat plate 25. Thus, the guide heat plate 25 is capable of covering the mounting opening 211 and flush with the frame 21 for closely touching with a heat generation unit (not shown).

The support parts 22 each have an end integrally joining with the frame 21 and another end extends outward with a fixing hole 221.

Figure 8:
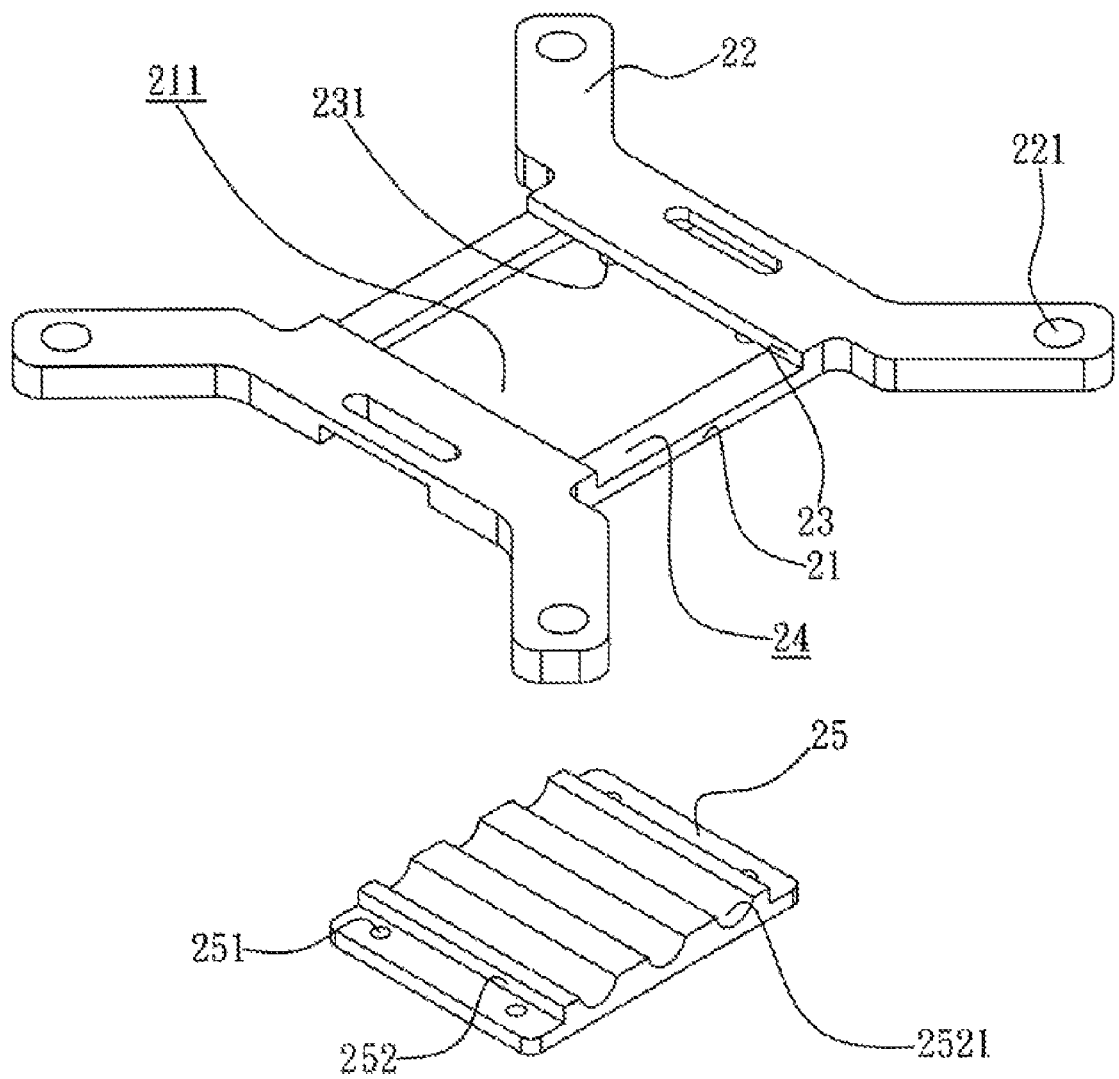
FIG. 8 is a disassembled perspective view of the second embodiment of a support device for heat dissipation module according to the present invention.
Figure 9:
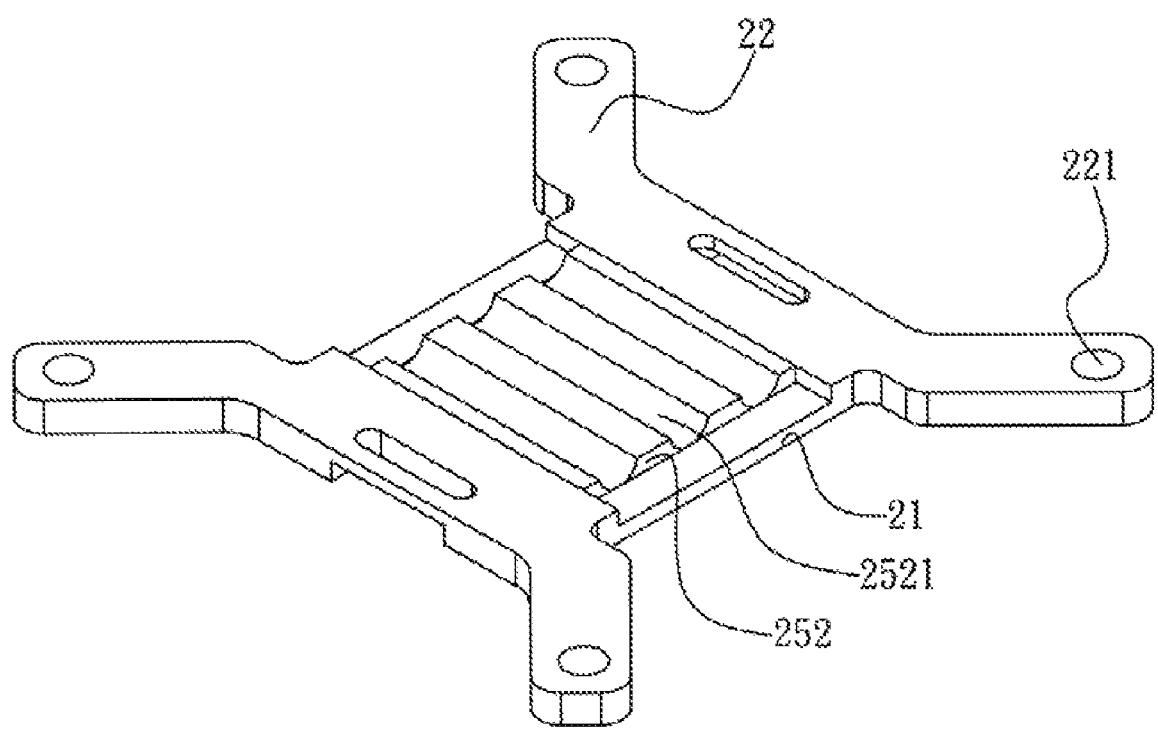
FIG. 9 is an assembled perspective view of the support device shown in FIG. 9.

Referring to FIGS. 8 and 9, another embodiment of a support device for a heat dissipation module according to the present invention is illustrated. The entire structure and function of the second embodiment is almost the same as the first embodiment and the identical parts with the same functions will be designated with the same reference numerals and no detail will be described further. The difference of the second embodiment from the first embodiment is in that the guide heat plate 25 provides a receiving part 252 jutting out from the bottom thereof corresponding to where the mounting opening 211 communicating with the recess 24. The receiving part 252 has at least a groove 2521 for facilitating connection with the heat absorption end of a heat pipe.

The frame and the support parts can be made integrally as a single piece by means of casting and the guide heat sheet is joined to the frame with tight fit or riveting instead of plating process done in the conventional art. Hence, the guide heat sheet is thinner than that of conventional art with less production cost.

While the invention has been described with referencing to preferred embodiments thereof, it is to be understood that modifications or variations may be easily made without departing from the spirit of this invention, which is defined by the appended claims.

What is claimed is:

1. A support device for heat dissipation module comprising:
   a frame having a top side and a bottom side, providing a rectangular mounting opening at the central area thereof, and two rectangular projection parts being joined to the bottom side and extending along two opposite sides of the mounting opening respectively with two ends of each of the projection part crossing another two opposite sides of the mounting opening and a plurality of fitting pins extending outward from an upper surface of the respective projection part;
   a guide heat plate, having a flat upper side, providing a plurality of fitting holes corresponding to the fitting pins to fit with said fitting pins
   characterized in that a dimension confined between the mounting opening and the projection parts is the same as the guide heat plate, the upper side of the guide heat plate is flush with the top side of the frame, and the fitting pins tightly fits with outer ends of the fitting holes being flush with guide heat plate such that no welding work is required to fix the guide heat plate to the projection parts.

2. The support device for heat dissipation module as defined in claim 1, wherein a recess is formed by the projection plate and the recess communicates with the mounting opening.

3. The support device for heat dissipation module as defined in claim 1, wherein four corners of the frame extend outward as a support part respectively.

4. The support device for heat dissipation module as defined in claim 1, wherein the upper surface of the guide heat plate is flat.

* * * * *